(12) United States Patent
Srirattana

(10) Patent No.: US 10,826,463 B2
(45) Date of Patent: *Nov. 3, 2020

(54) SIGNAL SWITCHING SYSTEMS AND ELECTRONIC DEVICES USING SAME

(71) Applicant: SKYWORKS SOLUTIONS, INC., Woburn, MA (US)

(72) Inventor: Nuttapong Srirattana, Lexington, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,185

(22) Filed: Jun. 26, 2019

(65) Prior Publication Data

US 2019/0319607 A1    Oct. 17, 2019

Related U.S. Application Data

(63) Continuation of application No. 15/987,026, filed on May 23, 2018, now Pat. No. 10,447,242.

(Continued)

(51) Int. Cl.
| | |
|---|---|
| *H03H 11/34* | (2006.01) |
| *H01Q 1/50* | (2006.01) |
| *H03F 3/19* | (2006.01) |
| *H04B 1/48* | (2006.01) |
| *H03F 3/21* | (2006.01) |
| *H03F 3/68* | (2006.01) |

(Continued)

(52) U.S. Cl.
CPC ............. *H03H 11/342* (2013.01); *H01Q 1/50* (2013.01); *H03F 3/19* (2013.01); *H03F 3/21* (2013.01); *H03F 3/245* (2013.01); *H03F 3/68* (2013.01); *H03F 3/72* (2013.01); *H03K 17/063* (2013.01); *H03K 17/693* (2013.01); *H04B 1/48* (2013.01); *H03F 2200/111* (2013.01); *H03F 2200/451* (2013.01); *H03F 2203/7209* (2013.01); *H03K 2017/066* (2013.01); *H04B 2001/485* (2013.01)

(58) Field of Classification Search
CPC .................................................. H03H 11/342
See application file for complete search history.

(56) References Cited

U.S. PATENT DOCUMENTS

| | | | |
|---|---|---|---|
| 7,508,264 B1 * | 3/2009 | Terrovitis | .................. H03F 3/19 330/253 |
| 2006/0194567 A1 | 8/2006 | Kelly et al. | |

(Continued)

*Primary Examiner* — Hsinchun Liao
(74) *Attorney, Agent, or Firm* — Lando & Anastasi, LLP

(57) ABSTRACT

An example of a signal switch includes a first transistor coupled between first and second nodes, a plurality of second transistors coupled in series between the first and second nodes, in parallel with the first transistor, a third transistor coupled between the first node and a third node, and a plurality of fourth transistors coupled in series between the first and third nodes, in parallel with the third transistor. The signal switch further includes a first shunt path including a first shunt transistor and a first inductor connected in series between a reference node and a first connection point between two of the plurality of second transistors, and a second shunt path including a second shunt transistor and a second inductor connected in series between the reference node and a second connection point between two of the plurality of fourth transistors.

20 Claims, 14 Drawing Sheets

Related U.S. Application Data

(60) Provisional application No. 62/510,296, filed on May 24, 2017.

(51) Int. Cl.
*H03K 17/693* (2006.01)
*H03F 3/24* (2006.01)
*H03F 3/72* (2006.01)
*H03K 17/06* (2006.01)

(56) References Cited

U.S. PATENT DOCUMENTS

| | | |
|---|---|---|
| 2009/0207082 A1 | 8/2009 | Raghuraman |
| 2011/0032021 A1 | 2/2011 | Dianbo |
| 2014/0043886 A1 | 2/2014 | Wu et al. |
| 2014/0240048 A1 | 8/2014 | Youssef et al. |
| 2016/0181987 A1 | 6/2016 | Perreault et al. |

* cited by examiner

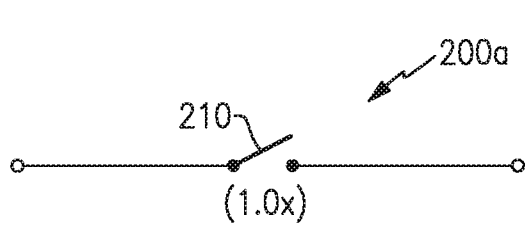
FIG.5A
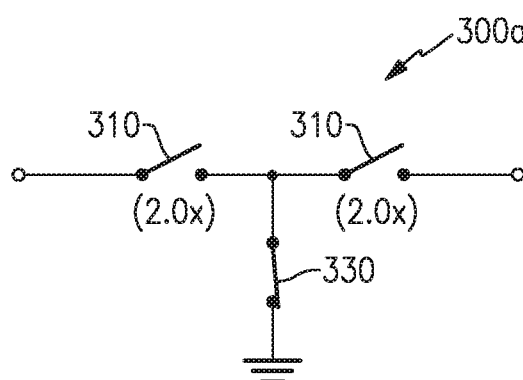
FIG.5B
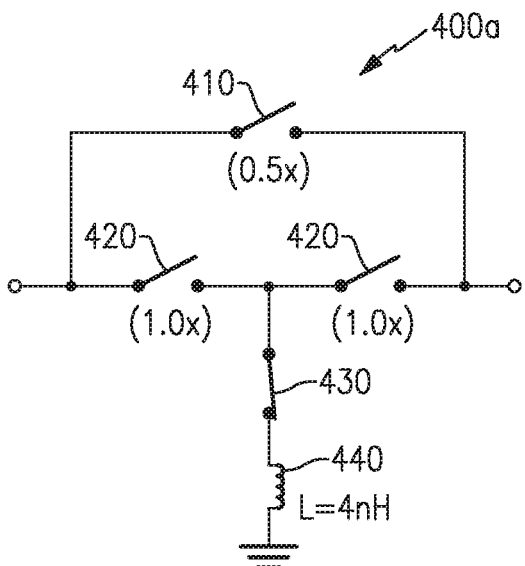
FIG.5C
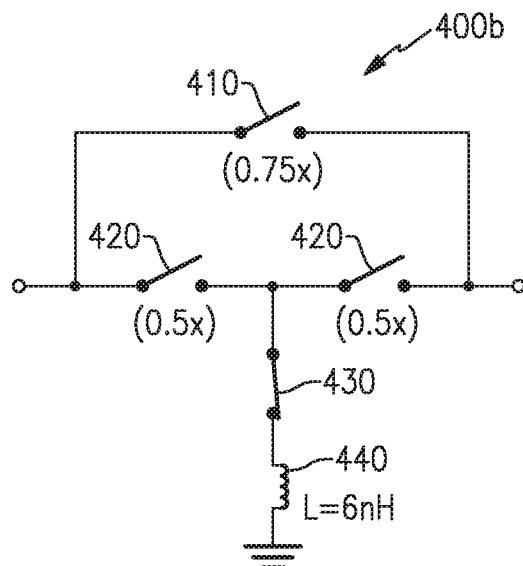
FIG.5D
| SWITCH PERFORMANCE AT, e.g., f=3800 MHz | INSERTION LOSS | ISOLATION | TRANSISTOR AREA |
|---|---|---|---|
| SINGLE/SERIES (e.g., 200a) | 0.42 dB | 18.8 dB | 1x |
| SERIES WITH SHUNT (e.g., 300a) | 0.69 dB | 29.8 dB | 4x |
| HYBRID A (e.g., 400a) | 0.55 dB | 39.8 dB | 2.5x |
| HYBRID B (e.g., 400b) | 0.43 dB | 23.0 dB | 1.75x |
FIG.5E

SIGNAL SWITCHING SYSTEMS AND ELECTRONIC DEVICES USING SAME

CROSS-REFERENCE TO RELATED APPLICATIONS

This application claims the benefit under 35 U.S.C. § 120 of co-pending U.S. patent application Ser. No. 15/987,026 titled "SIGNAL SWITCHING SYSTEMS AND MODULES AND DEVICES USING SAME," filed on May 23, 2018, which claims the benefit under 35 U.S.C. § 119(e) of U.S. Provisional Patent Application No. 62/510,296 titled SIGNAL SWITCHING SYSTEMS AND MODULES AND DEVICES USING SAME, filed on May 24, 2017, each of which is hereby incorporated by reference in its entirety for all purposes.

BACKGROUND

Signal switching systems are widely used in front end module (FEM) products, such as in radio transceivers, wireless handsets, cable modems, and the like. It is often desirable to direct, route, or electronically switch signals, especially electromagnetic signals in the MHz and GHz range, e.g., radio frequency (RF), intended for transmission over wired or wireless interfaces. For example, a switch may route a signal to one antenna when placed in a first condition (or state) and may route the signal to a second antenna when placed in a second condition. Such capability may be desirable, for example, when the two antennas exhibit differing or varying performance characteristics, or when the two antennas are designed for different frequency bands in which a common transceiver or amplifier may operate, or when transitioning between a transmit and a receive operation, etc.

When a signal switch is in an on state (connected, conducting) it is meant to pass a signal through with minimal loss. Additionally, when the signal switch is in an off state (disconnected, non-conducting) it is meant to reject the signal, i.e., to not allow the signal to pass through or to significantly attenuate any signal passing through.

Signal switches have performance characteristics taken into account when designing the switch, a module, or a device. For example, a switch component has an insertion loss, typically expressed in decibels (dB), representing a reduction in signal strength due to the switch when on. Another performance characteristic of a switch is isolation, also typically expressed in dB, which is a measure of the switch's ability to reject the signal when the switch is off. In general, signal switches are imperfect and allow some signal through even when off (measured as, e.g., "isolation") and fail to allow the full signal strength through when on (measured as, e.g., "insertion loss"). It is desirable to have low insertion loss when on and high isolation when off.

SUMMARY OF INVENTION

Aspects and embodiments are directed to switching systems for selectively routing or directing signals, and are particularly applicable to wired and wireless communications devices. As discussed in more detail below, various component arrangements provide multiple signal paths to increase the amount of a signal passed when on, thereby providing lower insertion loss, and include phase interference features to decrease the amount of signal passed when off, thereby providing higher isolation.

According to one aspect, a signal switch is provided and includes a first node and a second node, a first transistor coupled between the first and second nodes, a plurality of second transistors coupled in series between the first and second nodes, in parallel with the first transistor, and a shunt path including a shunt transistor and an inductor coupled in series and having a first connection between two of the plurality of second transistors and a second connection at a reference node.

Some examples include a control input configured to receive a control signal and coupled to the first transistor, the plurality of second transistors, and the shunt transistor, the control input being configured to selectively control an operational state of the first, second, and shunt transistors to allow a signal to pass between the first and second nodes in a first operational state and to reject the signal from passing between the first and second nodes in a second operational state. In some examples an inverter is coupled between the control input and the shunt transistor, the inverter configured to apply the control signal to the shunt transistor to cause the shunt transistor to be in an opposing conductive state relative to a conductive state of the first and second transistors. Some examples include a control resistor coupled between the control input and at least one of the first, second, and shunt transistors.

In certain examples, the shunt path may include a plurality of shunt transistors coupled in series with the inductor. Additionally or alternatively, the first transistor may be a plurality of first transistors coupled in series between the first and second nodes.

The reference node may be ground.

Some examples also include a third node, a third transistor coupled between the first and third nodes, a plurality of fourth transistors coupled in series between the first and third nodes, in parallel with the third transistor, and an additional shunt path including a further shunt transistor and a further inductor coupled in series and connected between the reference node and a connection point between two of the plurality of fourth transistors.

According to another aspect, a switch module is provided that includes first, second, and third nodes, a first transistor coupled between the first and second nodes, a plurality of second transistors coupled in series between the first and second nodes, in parallel with the first transistor, a third transistor coupled between the first and third nodes, a plurality of fourth transistors coupled in series between the first and third nodes, in parallel with the third transistor, a first shunt path including a first inductor-transistor circuit connected between a reference node and a connection point between two of the plurality of second transistors, and a second shunt path including a second inductor-transistor circuit connected between the reference node and a connection point between two of the plurality of fourth transistors. Some examples include a control input to receive a control signal and configured to selectively control the switch module between at least two operational states, a first state of the two operational states allowing a signal to pass between the first and second nodes and rejecting a signal from passing between the first and third nodes, and a second state of the two operational states allowing a signal to pass between the first and third nodes and rejecting a signal from passing between the first and second nodes. An inverter may be configured to apply the control signal to a subset of the transistors to cause the subset to be in an opposing conductive state relative to a remainder of the transistors not included in the subset. A control resistor may be coupled between the control input and at least one of the first, second, third, fourth, and first and second shunt path transistors.

In certain examples, at least one of the first and second shunt paths includes a plurality of shunt transistors. Additionally or alternatively, the first transistor may be a plurality of first transistors coupled in series between the first and second nodes.

The reference node may be ground.

According to yet another aspect, an electronic device is provided and includes a transceiver coupled to a first node and configured to produce a transmit signal, a first transistor coupled between the first node and a second node, a plurality of second transistors coupled in series between the first and second nodes, in parallel with the first transistor, and a shunt path including a shunt transistor and an inductor coupled in series and having a first connection between two of the plurality of second transistors and a second connection to a reference node.

In certain examples, an antenna is coupled to the second node, the antenna being configured to transmit the transmit signal and to receive a receive signal.

Some examples include an electromagnetic coupler coupled to the second node.

Some examples include a power amplifier connected to the transceiver and configured to amplify the transmit signal.

Some examples include at least one of a sensor module, a memory, a baseband sub-system, a user interface, and a battery.

Some examples include a control input configured to receive a control signal and coupled to the first transistor, the plurality of second transistors, and the shunt transistor, the control input being configured to selectively control an operational state of the first, second, and shunt transistors to allow a signal to pass between the first and second nodes in a first operational state and to reject a signal from passing between the first and second nodes in a second operational state. An inverter may be configured so the control signal applied to the shunt transistor causes the shunt transistor to be in an opposing conductive state to that of the first and second transistors. A control resistor may be coupled between the control input and at least one of the first, second, and shunt transistors.

In certain examples, the shunt path includes a plurality of shunt transistors coupled in series with the inductor. Additionally or alternatively, the first transistor may be a plurality of first transistors coupled in series between the first and second nodes.

The reference node may be ground.

Some examples include a third node, a third transistor coupled between the first and third nodes, a plurality of fourth transistors coupled in series between the first and third nodes, in parallel with the third transistor, and an additional shunt path including a further shunt transistor and a further inductor coupled in series and connected between the reference node and a connection point between two of the plurality of fourth transistors.

Still other aspects, embodiments, examples, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIGS. 5A-5D are schematic diagrams of various examples of the switches of FIGS. 2A-4D;

FIG. 5E is a table of performance characteristics of the switches of FIGS. 5A-5D;

DETAILED DESCRIPTION

Figure 1A:
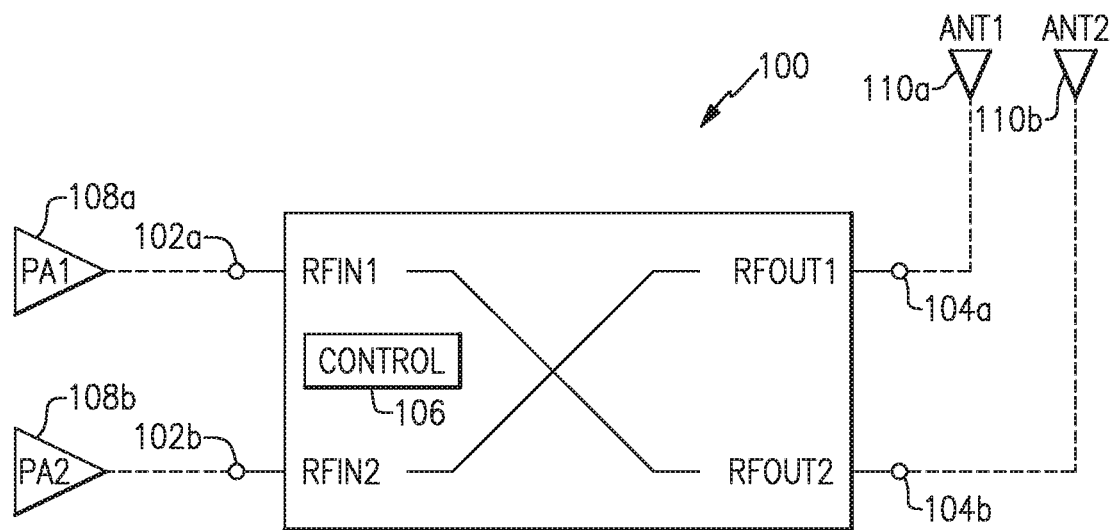
FIG. 1A is a schematic symbol of an example of a signal swap switch.

Wireless and other communication devices use electromagnetic signal switches to route radio frequency or other signals among components. For example, signal switches are often used to provide a signal to or from one or more antennas, couplers, amplifiers, etc. A signal switch may direct a transmit signal to one antenna when operating in a certain frequency band and may direct the signal to a different antenna when operating in a different frequency band. Similarly, a signal switch may be used to direct the signal to one of multiple antennas based upon which antenna has the best operating characteristics at any given time. For example, a cellular telephone may have multiple antennas and depending upon the environment, orientation, nearby objects, and direction to the cellular base station, among other factors, one of the antennas may achieve a better transmission quality with the base station (based on link quality, error rates, antenna mismatch, impedance, etc.) than the other antennas. In such case, a transceiver, baseband sub-system, or other controller may cause a signal switch to direct signals to or from the antenna with the best performance. Signal switches may also be used to connect or disconnect signal paths without routing the signals elsewhere, i.e., they may be used simply for on/off functionality rather than switching between multiple alternatives, or may provide any combination of these. Signal switches may also be used to connect or route signals to one or more amplifiers, receivers, attenuators, modulators, up-converters, down-converters, or other device components.

Aspects and examples of signal switches disclosed herein provide improved isolation, i.e., signal rejection when operated to disconnect a signal path, and improved insertion loss, i.e., signal loss due to the switch when operated to connect a signal path. Aspects and examples disclosed herein include multiple signal paths when the switch is operating to connect, or pass, a signal, and may include phase and interference features to improve isolation when operated to disconnect, or reject, a signal.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

FIG. 1A illustrates operational characteristics of a 2-by-2 swap switch 100, which is a switching component with two inputs that each may be selectively connected to one of two outputs. In various examples such a switch may have more inputs and/or more outputs than the two shown in FIG. 1A. The swap switch 100 shown in FIG. 1A has two inputs 102 and two outputs 104 and a control mechanism 106 to control internal switching elements of the swap switch 100 to alternately connect the first input 102a to either of the first output 104a or the second output 104b. Likewise, internal switching elements are capable of alternately connecting the second input 102b to either of the first output 104a or the second output 104b. The switching elements can be controlled such that each input 102 is connected to only one output 104 at any given time, and such that the inputs 102 are never connected to each other and the outputs 104 are never connected to each other. Alternately, various embodiments and applications may allow any connections to be made. The swap switch 100 is shown in an example of a typical use scenario, which is to couple one or more amplifiers 108 to one or more antennas 110. In this example, each of the amplifiers 108 amplifies various transmit signals and the swap switch 100 routes each transmit signal to one of the antennas 110 based upon the control 106.

Figure 1B:
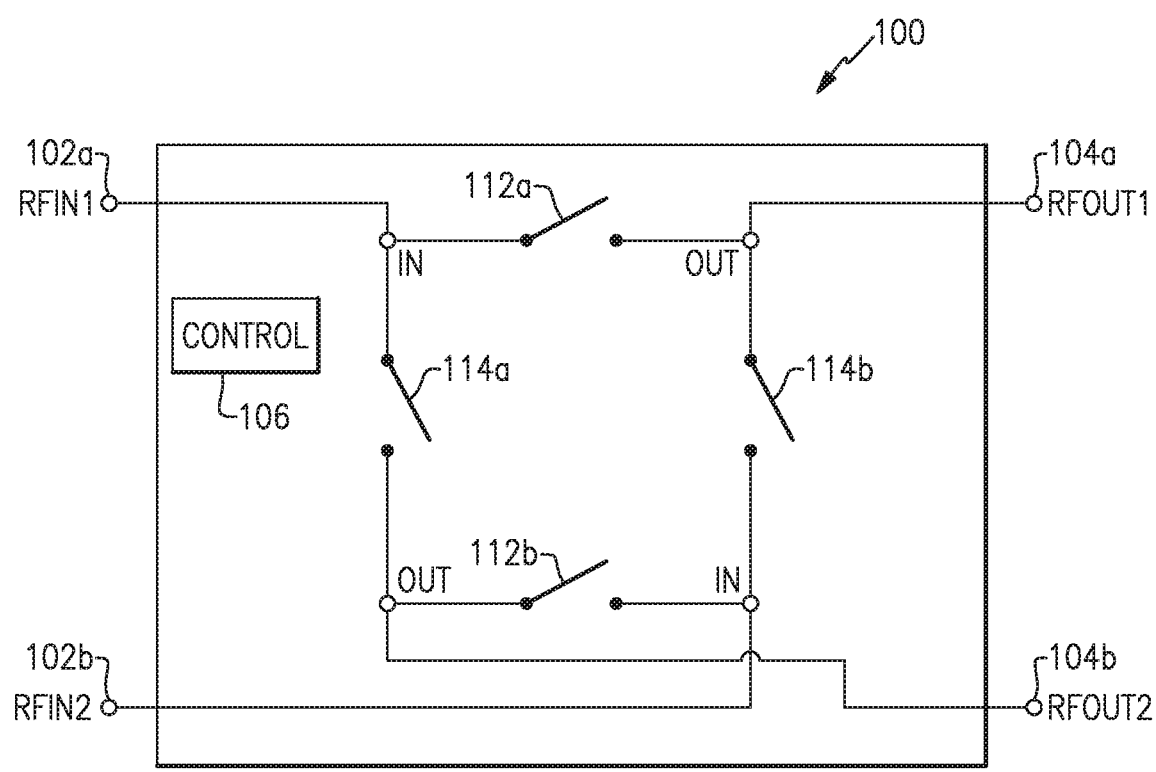
FIG. 1B is a schematic diagram of an example of an implementation of the swap switch of FIG. 1A.

FIG. 1B illustrates further schematic detail of the swap switch 100. The swap switch 100 includes two direct switches 112 and two shift switches 114. The direct switches selectively couple each of the inputs 102 to a respective output 104 while the shift switches 114 selectively couple each of the inputs 102 to a shifted, or swapped, output 104. More specifically, direct switch 112a selectively couples the first input 102a to the first output 104a, and the direct switch 112b selectively couples the second input 102b to the second output 104b. When the direct switches 112 are controlled to be on (i.e., conducting) each of the inputs 102 are directly connected to their respective outputs 104. Such a configuration may also be described as connecting an "A" input to an "A" output, and connecting a "B" input to a "B" output. To swap the connections, the direct switches 112 are controlled to be off (i.e., non-conducting) and the shift switches 114 are controlled to be on. In such a configuration, the inputs 102 are connected to their swapped outputs 104, which may also be described as connecting the "A" input to the "B" output, and connecting the "B" input to the "A" output. The swap switch 100 may also be called an A/B switch. The swap switch 100 is a 2×2 switch in that it has two inputs and two outputs. Further examples of a swap switch may have any number of inputs (M) and outputs (N) and may generally be referred to as an M×N switch.

Aspects and embodiments of signal switches disclosed herein may be beneficially used in the production of swap switches, such as the swap switch 100, or any other switching elements or components of a device that requires signal switching. The swap switch 100 is provided merely as an example of a component in which signal switches in accord with those disclosed herein may be used.

Figure 2A:
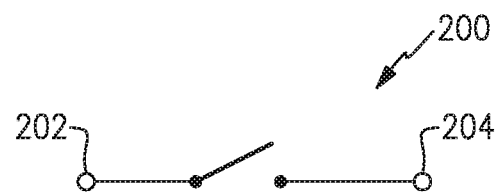
FIG. 2A is a schematic diagram of an example of a signal switch.
Figure 2B:
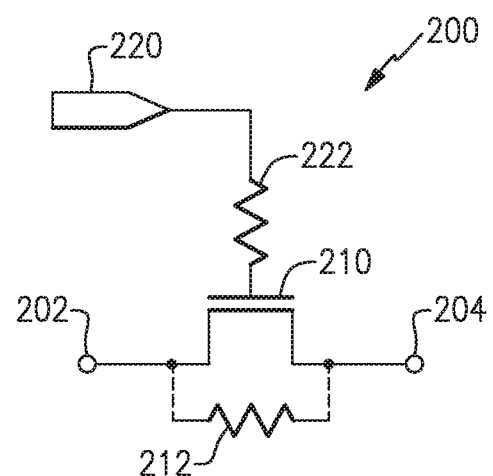
FIG. 2B is a diagram of an example of a transistor implementation of the switch of FIG. 2A.

FIG. 2A illustrates one example of a schematic symbol of a single switch 200 having an input 202 node and an output 204 node. At least one example of a transistor-based implementation of the switch 200 is illustrated in FIG. 2B. The switch 200 may include a transistor 210, such as a field effect transistor (FET), a bipolar junction transistor (BJT), or other suitable transistor capable of conducting a signal from the input 202 to the output 204, and includes a control input 220 coupled to the transistor 210, optionally through a resistor 222. A control voltage received at the control input 220 is applied to a controlling element of the transistor 210, such as the gate of a FET or the base of a BJT, or the like, causing the transistor 210 to be in either one of a conducting state (on) or a non-conducting state (off). Certain examples may include a resistor 212 in parallel with a channel or junction of the transistor 210. For clarity in the figures, a resistor such as the resistor 212 will not generally be shown.

Figure 2C:
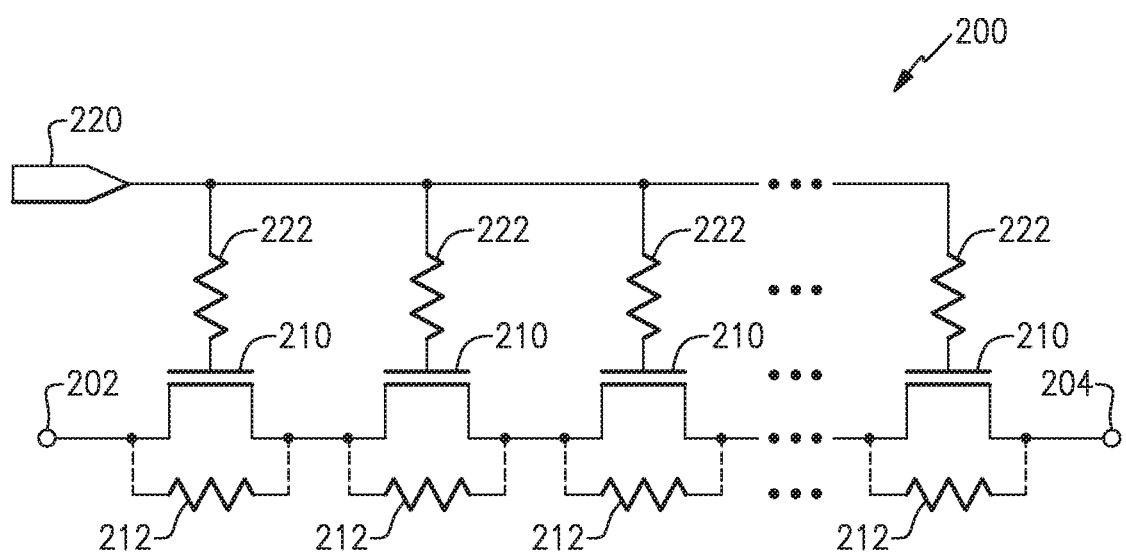
FIG. 2C is a diagram of a further example of a transistor implementation of the switch of FIG. 2A.

FIG. 2C illustrates a further example of a transistor-based implementation of a switch 200, including a plurality of transistors 210 connected in series between the input 202 and the output 204, and including a common control input 220. Various examples of switching elements disclosed herein, to provide a switching capability between two nodes or terminals, e.g., 202, 204, may include a plurality of transistors, such as in the plurality of transistors 210 illustrated in the example of FIG. 2C. For clarity in the figures, transistor-based switching between two nodes or terminals may be illustrated with a single transistor though a plurality of transistors connected in series, such as in the example of FIG. 2C, may exist in any particular physical implementation.

It should be appreciated that the switch 200, across the various examples shown in FIGS. 2A-2C, is symmetrical with respect to the input 202 and the output 204 such that interchanging the input 202 and the output 204 has no effect on the operation of the switch 200. It should also be appreciated that a transistor-based switch 200 may also include additional transistors 210 connected in series.

Figure 2D:
FIG. 2D is a schematic operational model of the switch of FIG. 2B in an on state.

FIG. 2D is an operational model of the transistor-based switch 200 of FIG. 2B when in an on state. In the on state, the transistor 210 nonetheless absorbs some signal energy traveling from the input 202 to the output 204 and is therefore modeled as a resistor 210a, which contributes to loss of signal energy and dissipates the energy lost as heat. Accordingly, when in the on state, the switch 200 causes signal energy loss which is measured as insertion loss, typically in decibels (dB). For a given type of transistor 210, the equivalent resistor 210a has a resistance value that is approximately inversely proportional to the size of the transistor 210. A larger transistor 210 has a smaller resistance when on, and designing the transistor 210 with twice the size approximately halves the resistance value. Accordingly, a larger transistor 210 has lower insertion loss.

Figure 2E:
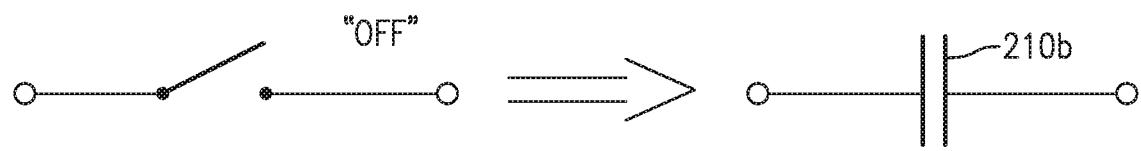
FIG. 2E is a schematic operational model of the switch of FIG. 2B in an off state.

FIG. 2E is an operational model of the transistor-based switch 200 of FIG. 2B when in an off state. In the off state, some signal energy received at the input 202 is nonetheless allowed by the transistor 210 to pass through to the output 204, with a frequency dependence that may be modeled as a capacitor 210b. "Isolation" is a measure of the level to which the switch 200 allows signal energy to pass when in the off state, and is typically also expressed in decibels (dB). For a given type of transistor 210, a larger transistor 210 allows more signal energy to pass when off and accordingly has lower isolation.

In accord with the above discussion, a transistor 210 used as a switch 200 involves a trade-off between insertion loss and isolation performance. A larger transistor 210 has better insertion loss but has worse isolation. A smaller transistor 210 has worse insertion loss but better isolation.

Figure 3A:
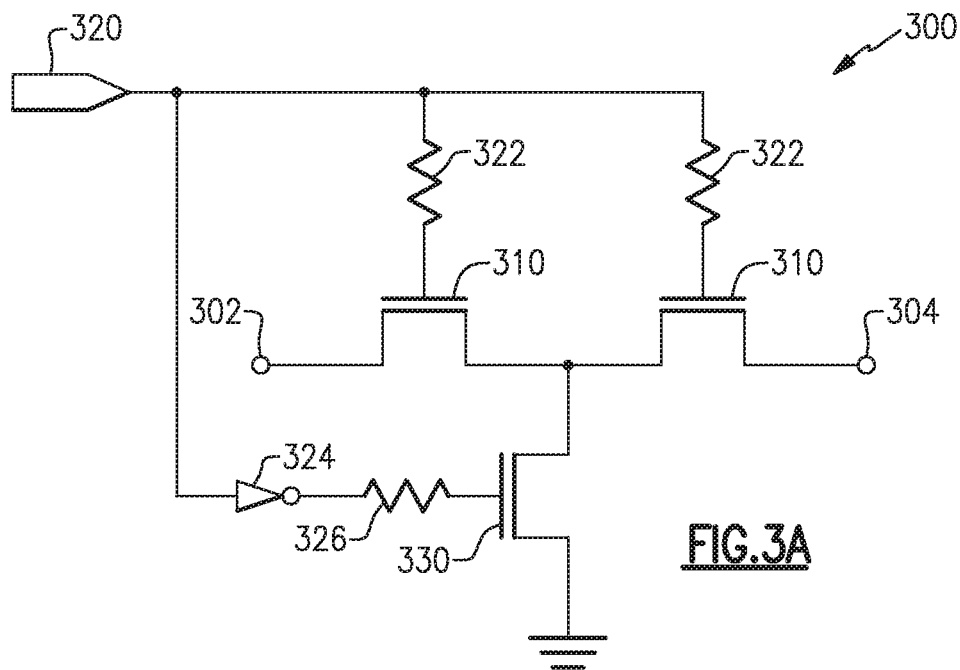
FIG. 3A is a diagram of an example of an alternate transistor implementation of a switch.

FIG. 3A illustrates a transistor-based switch 300 including at least two transistors 310 in series, a control input 320, and at least one shunt transistor 330 between at least two of the series-connected transistors 310. When the switch 300 is off, the shunt transistor 330 is controlled to be on while the series transistors 310 are controlled to be off. The switch 300 is controlled in a manner similar to switch 200, by a voltage received at the control input 320, such voltage being applied to a gate or base of each series-connected transistor 310, either directly or via a resistor 322. A voltage inverter 324 similarly applies a voltage to the shunt transistor 330, directly or through a resistor 326, so that the shunt transistor 330 is controlled to be in an opposite state, on or off, from the series-connected transistors 310. Alternately, the shunt transistor 330 may be controlled by an additional control input or by other means. The shunt transistor 330 increases isolation performance over that of the switch 200, at least in part, by grounding the electrical connection between the series-connected transistors 310 when the switch 300 is in the off state. Such reduces the signal energy allowed to pass through to the output 304 when the switch 300 is off. When the switch 300 is on, however, it includes at least two transistors 310 through which the signal travels. Accordingly, for similarly sized transistors, the switch 300 has a higher insertion loss than the switch 200. The trade-off between insertion loss and isolation is discussed further with reference to FIG. 3C and FIG. 3D. It should be appreciated that the switch 300 may include additional series-connected transistors 310 and/or additional series-connected transistors 330 in the shunt path.

Figure 3B:
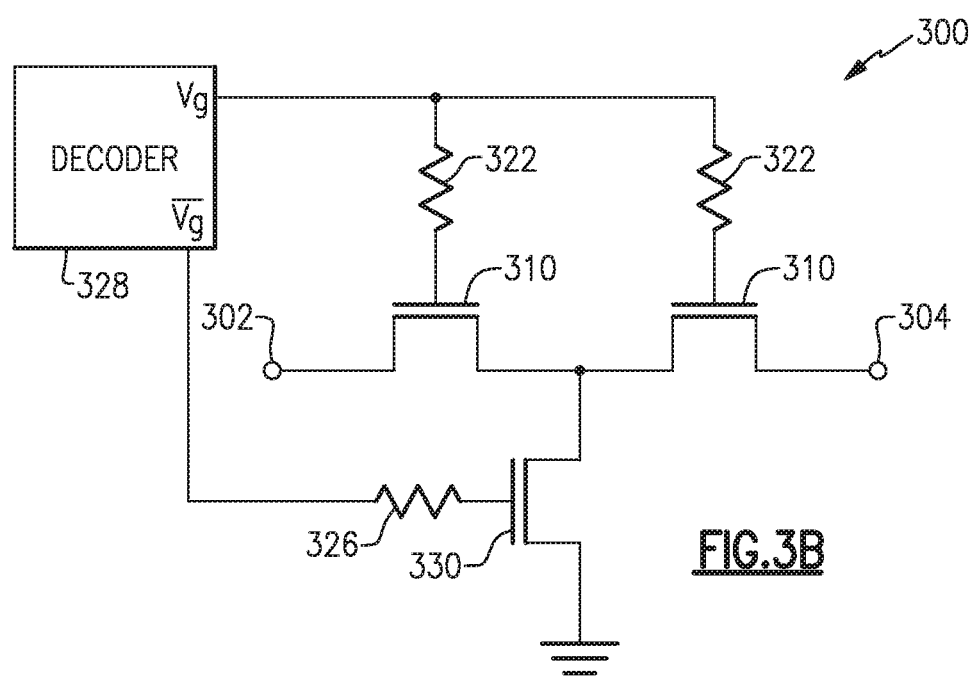
FIG. 3B is a diagram of an alternate implementation of the switch in FIG. 3A.

FIG. 3B illustrates an alternate control of the example transistor-based switch 300. The switch 300 of FIG. 3B includes a control component 328, which may be a decoder, capable of providing control signals to the various control elements of the transistors. In the example switch 300, the control elements are gates, and the control component 328 may provide an appropriate gate voltage, $V_g$, to turn on or off the series transistors 310. The control component 328 also provides a "reverse" or inverted voltage, $\overline{V}_g$, suitable to control the shunt transistor 330 to be in a reverse state, e.g., off or on, as compared to the series transistors 310. Throughout the figures, any control input, and any inverted control input, may receive control voltages provided by a control component similar to the control component 328.

Figure 3C:
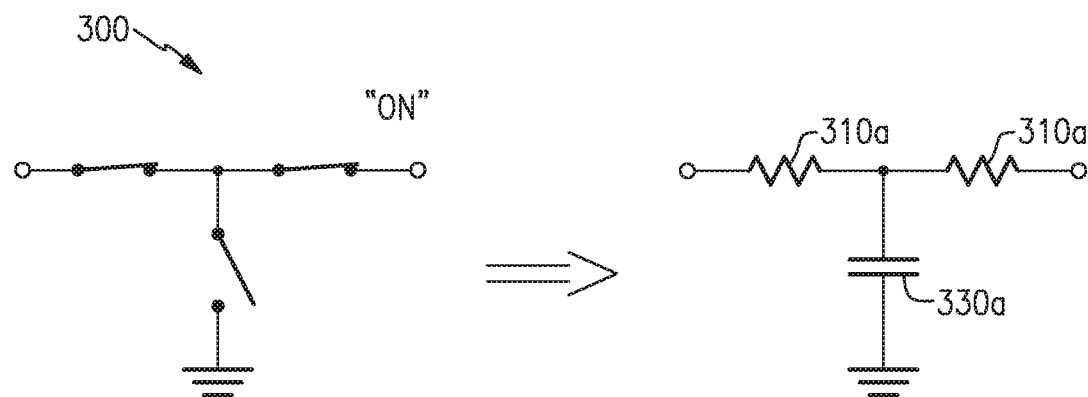
FIG. 3C is a schematic operational model of the switch of FIG. 3A in an on state.
Figure 3D:
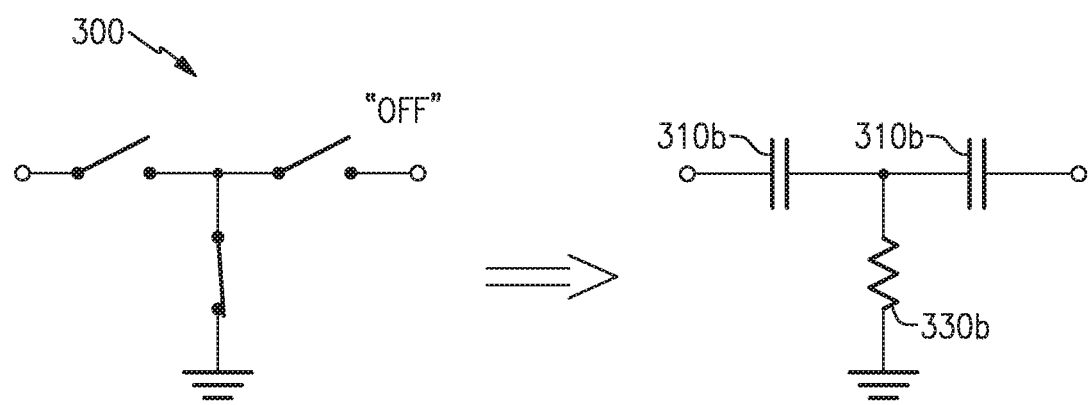
FIG. 3D is a schematic operational model of the switch of FIG. 3A in an off state.

FIG. 3C is an operational model of the transistor-based switch 300 of FIG. 3A when in an on state, including two series resistors 310a and a shunt capacitor 330a. FIG. 3D is an operational model of the transistor-based switch 300 when in an off state, including two series capacitors 310b and a shunt resistor 330b. If identical transistors are used in the switch 300 as the switch 200, the switch 300 achieves better isolation but worse insertion loss. Isolation is better (as modeled in the off state) due to the action of the shunt resistor 330b diverting to ground a substantial amount of signal energy that passes through the first capacitor 310b and thereby reducing the amount of signal energy reaching the output 304. Insertion loss is worse (as modeled in the on state) because there are two resistors 310a connected in series, which substantially doubles the energy loss on the signal path from the input 302 node to the output 304 node. The shunt capacitor 330a also causes some energy to be lost and diverted to ground, but this effect may be less substantial than that of the resistors 310a in the series signal path.

The switch 300 may be designed to achieve better insertion loss (i.e., less insertion loss) by decreasing the resistance value of the series resistors 310a, which may be achieved by selecting or designing the transistors 310 with a larger size. Accordingly, a substantial trade-off for improving the insertion loss is the cost of space ("real estate") used in the semiconductor fabrication.

It should be appreciated that the switch 200 achieves relatively good insertion loss for a given transistor size, but fairly poor isolation when off, while the switch 300 achieves relatively good isolation but requires significantly larger transistors to achieve a comparable insertion loss as the switch 200. Assuming a transistor of double the size achieves half the resistance when on, each of the transistors 310 may be twice (2×) the size of the single transistor 210 to achieve the same insertion loss. Therefore the switch 300 requires at least four times as much space as the switch 200 to achieve similar insertion loss (two transistors of twice the size each) when on, but a benefit of the switch 300 is improved isolation when off.

Figure 4A:
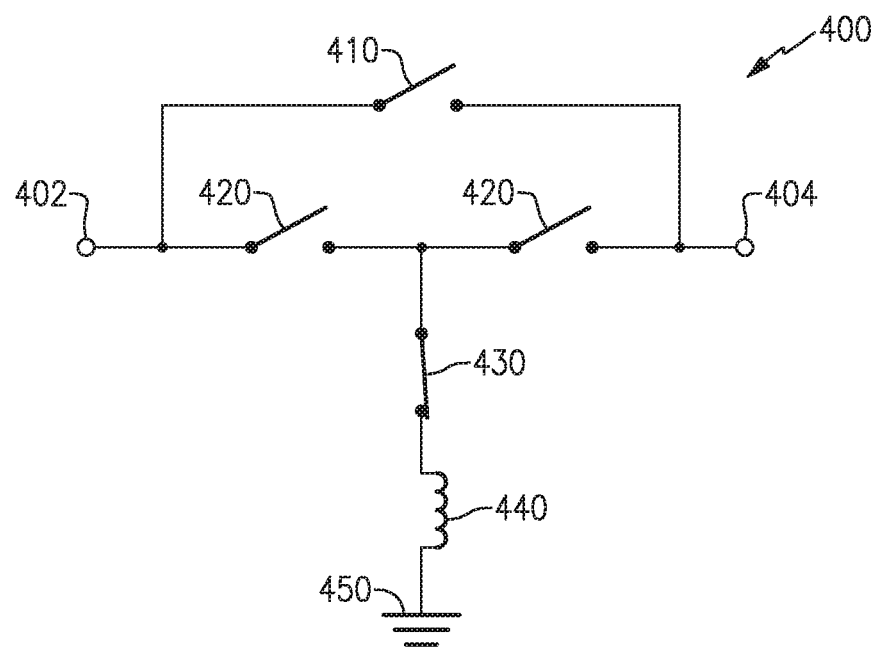
FIG. 4A is a schematic diagram of another example of a signal switch.

Further improvement of insertion loss and isolation, versus size and space, may be had with the schematic example of a switch 400 shown in FIG. 4A. The switch 400 includes at least one direct transistor 410 between an input 402 node and an output 404 node, at least two series transistors 420 in series between the input 402 and the output 404, and a shunt path including at least one shunt transistor 430 and an inductor 440 connected in series. The shunt path couples a node between at least two of the series transistors 420 and a reference node 450. The reference node 450 is shown as a ground reference in the figures but in certain examples it may be a different reference node.

Figure 4B:
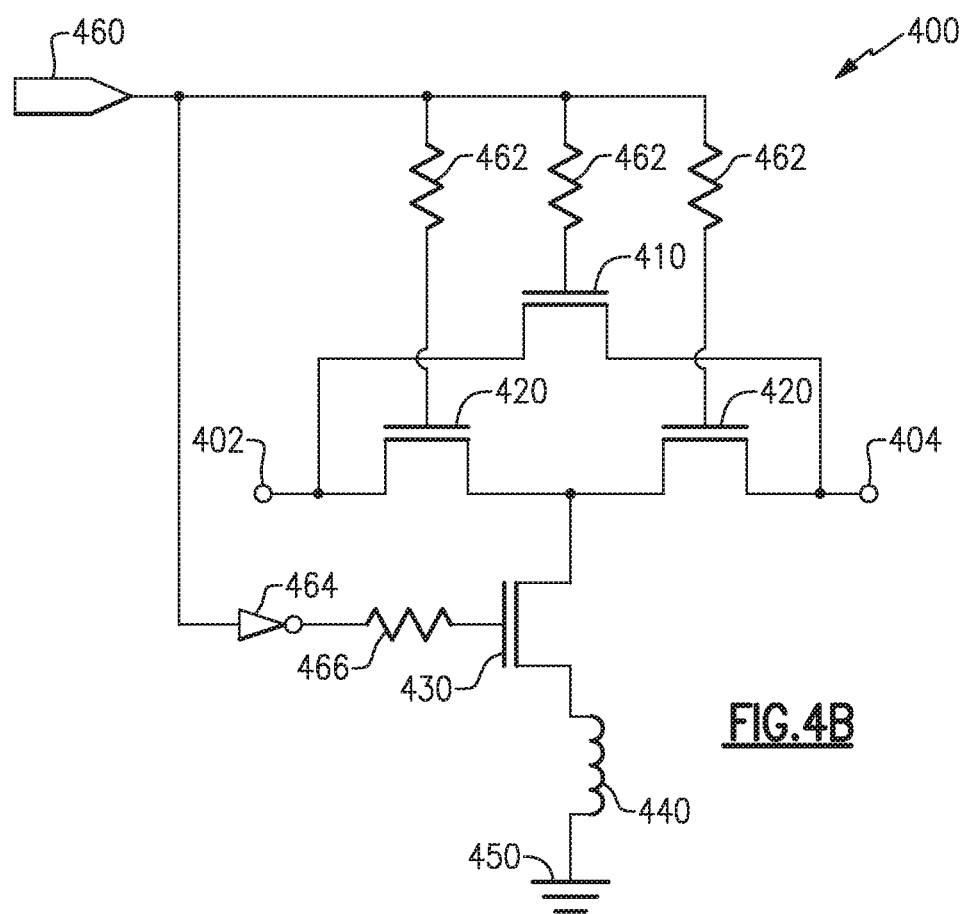
FIG. 4B is a diagram of an example of a transistor implementation of the switch of FIG. 4A.

A more detailed schematic of an example of an implementation of the switch 400 is shown in FIG. 4B. The switch 400 is controlled similarly to switches 200, 300, by a voltage received at a control input 460, such voltage being applied to a gate or base of each direct and series transistors 410, 420, either directly or via resistors 462, which may or may not all be of the same resistive values. A voltage inverter 464 similarly applies a voltage to the shunt transistor 430, directly or through a resistor 466, so that the shunt transistor 430 is controlled to be in an opposite state, on or off, from the direct and series transistors 410, 420. In some examples, as discussed above with respect to FIG. 3B, a control voltage may be provided to the shunt transistor 430 from a decoder rather than an inverter 464, or may be provided by other means.

Figure 4C:
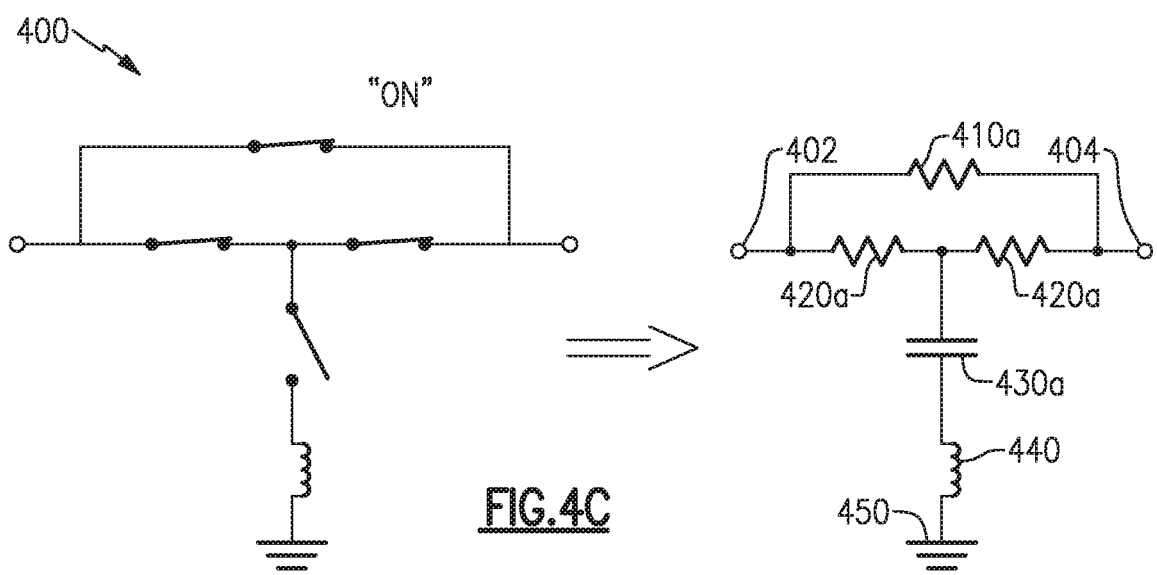
FIG. 4C is a schematic operational model of the switch of FIG. 4B in an on state.

A resistor-capacitor model of the switch 400 in the on state is shown in FIG. 4C. For certain size transistors, the switch 400 achieves better (lower) insertion loss than do the switches 200, 300, due at least in part to the fact that when in the on state, the switch 400 provides at least two signal paths from the input 402 to the output 404, a first signal path through the direct transistor 410 and, in parallel, a second signal path through the series transistors 420.

Figure 4D:
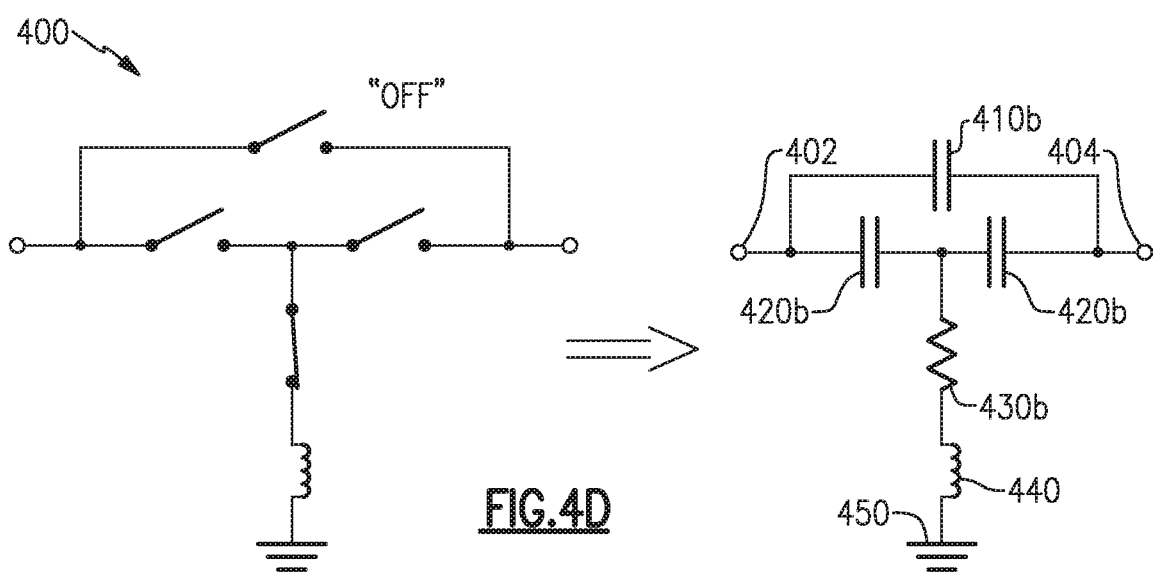
FIG. 4D is a schematic operational model of the switch of FIG. 4B in an off state.

A resistor-capacitor model of the switch 400 in the off state is shown in FIG. 4D. Again for certain size transistors, the switch 400 achieves better (higher) isolation than do the switches 200, 300, due at least in part to the fact that when in the off state, the switch 400 provides an LRC circuit that may be tuned, e.g., by selection of the inductive value of the inductor 440 in combination with the transistor selections and their accordant capacitive effects. When in the off state, the switch 400 provides two capacitor-based signal paths from the input 402 to the output 404, a first signal path through the (capacitive) direct transistor 410 and, in parallel, a second signal path through the (capacitive) series transistors 420, similar to the on state. By appropriate selection of the various transistors and the inductor 440, these two capacitor-based signal paths may interact with each other at the output 404 to cause destructive interference, e.g., by phase effects, and thereby enhance the rejection of a signal and reduce the amount of signal energy that traverses through the switch 400 from the input 402 to the output 404, when in the off state.

FIGS. 5A-5E are presented to illustrate selected performance characteristics of the various examples of switches 200, 300, and 400. Switch 200a shown in FIG. 5A includes a particular transistor 210 of a certain reference type and size. The size of transistor 210 establishes a reference size (1×) to which the sizes of other transistors will be referenced. In FIGS. 5A-5E, all examples of direct and series transistors, i.e., 210, 310, 410, and 420, are of the same type and design, however they vary in size from the reference transistor 210. Each of the transistor examples are labeled as to their size relative to the transistor 210. For reference, for the purposes of these examples and comparison of performance characteristics, the reference transistor 210 (1×) has an "on" resistance of 2 Ohms and an "off" capacitance of 100 femto-Farads. Additionally, each of the switches 200a, 300a, 400a, and 400b are shown in an off state, i.e., configured to isolate their respective input and output and not allow a signal to pass from the input to the output.

FIG. 5B illustrates a switch 300a with series transistors 310 double the size of the transistor 210. Each of the transistors 310 being double the size of the transistor 210 causes the resistance of each transistor 310, when in an on state, to be approximately half the resistance of the transistor 210. Because the switch 300a includes two such transistors 310 in series, the overall resistance of the switch 300a, when on, is comparable to the resistance of the switch 200a, when on. The switch 300a nonetheless exhibits worse insertion loss than the switch 200a when on at least in part due to parasitic effect of the shunt path. However, the switch 300a exhibits better isolation than switch 200a when off, at least in part due to the shunt transistor 330 providing a coupling to ground, and because two transistors 310 contribute to isolating the output from the input. Accordingly, the switch 300a is considered a potential replacement for the switch 200a with better isolation, but worse insertion loss and having more than four times (4×) the total semiconductor area.

FIG. 5C illustrates a switch 400a with a direct transistor 410 half the size of the reference transistor 210, series transistors 420 each equal in size to the reference transistor 210, and a shunt inductor 440 with inductance L=4 nano-Henries (nH). FIG. 5D illustrates a switch 400b similar to the switch 400a but with a direct transistor 410 three-quarter the size of the reference transistor 210, series transistors 420 each half the size of the reference transistor 210, and a shunt inductor 440 with inductance L=6 nH. As discussed above with respect to the switch 400 of FIGS. 4A-4D, the switches 400a and 400b exhibit better isolation than the switch 200a and better insertion loss than the switch 300a, without as much increase in semiconductor area as with the switch 300a.

FIG. 5E is a table of selected performance results for examples of the switches 200a, 300a, 400a, 400b at a frequency of f=3800 MHz. A set of performance goals for a switch at 3800 MHz may be, for example, to achieve isolation of about 25 dB or better when off and to achieve approximately 0.4 dB or better insertion loss when on. The results in FIG. 5E illustrate that the switch 200a fails to achieve the isolation metric, while the switch 300a achieves the isolation metric but at the expense of insertion loss and a significant increase in transistor area. The switch 400a exhibits improvement on all three metrics. i.e., insertion loss, isolation, and transistor area, in comparison to the switch 300a. Isolation for the switch 400a is particularly good and a trade-off may be made to further improve insertion loss and transistor area by accepting a lower isolation. Accordingly, the switch 400b achieves improved isolation relative to the switch 200a with less transistor area than the switch 300a or the switch 400a, and without degraded insertion loss. Accordingly, the switch 400b may be an "optimum" design as a substitute for any of the switches 200a, 300a, or 400a in a particular application.

It should be noted that the semiconductor area required to implement the shunt transistors 330 or 430 are not annotated in FIGS. 5B-5D and not included in the transistor area total of FIG. 5E. This is because the size of the shunt transistors in the various switch examples may be approximately the same in all cases, and it is expected that the desirability of improved isolation justifies the addition of a shunt path. Accordingly, the size impact of shunt transistor(s) may be common to the switches 300a, 400a, and 400b, and not make a significant difference in their comparisons. Additionally, the inductor 440 of the switches 400a, 400b take additional space but may be implemented external to the semiconductor area wherein the various transistors are implemented, and therefore the area required for the inductor 440 is not accounted for in the table of FIG. 5E.

In addition to the desirable performance characteristics documented in FIG. 5E, the examples of switches 400, 400a, 400b provide further benefits. For example, the switches 400, 400a, 400b provide an open circuit at both the input 402 and the output 404 when in an off state. Some conventional switch designs may increase isolation by providing a shunt path to, e.g., ground, but are arranged such that the shunt path to ground presents a short circuit at one of the input or the output when in the off state, causing such switch designs to be unsuitable for certain switching applications. Signal switches in accord with the examples of switches 400, 400a, 400b, however, present an open circuit to both the input port and the output port when in the off state.

Additionally, the switches 400, 400a, 400b may provide interference characteristics that may be beneficially applied to filter undesirable signals, such as unwanted harmonics. For example, FIG. 5E shows the characteristics of the switches 400a and 400b at 3800 MHz, but higher frequency bands, such as 5-8 GHz, may be beneficially rejected (in the on state) due to phase and resonance characteristics provided at least in part by the capacitance of the shunt transistor 430 and the inductance of the inductor 440. Further, while rejecting higher order harmonics, the switches 400a and 400b may nonetheless provide acceptable characteristics at lower frequency bands, e.g., 800 MHz, 950 MHz, 1900 MHz, and 2700 MHz, i.e., providing similar performance characteristics to those documented in FIG. 5E. Accordingly, suitable transistors and inductors may be selected to beneficially filter out undesired harmonics of operational frequency bands.

Figure 6A:
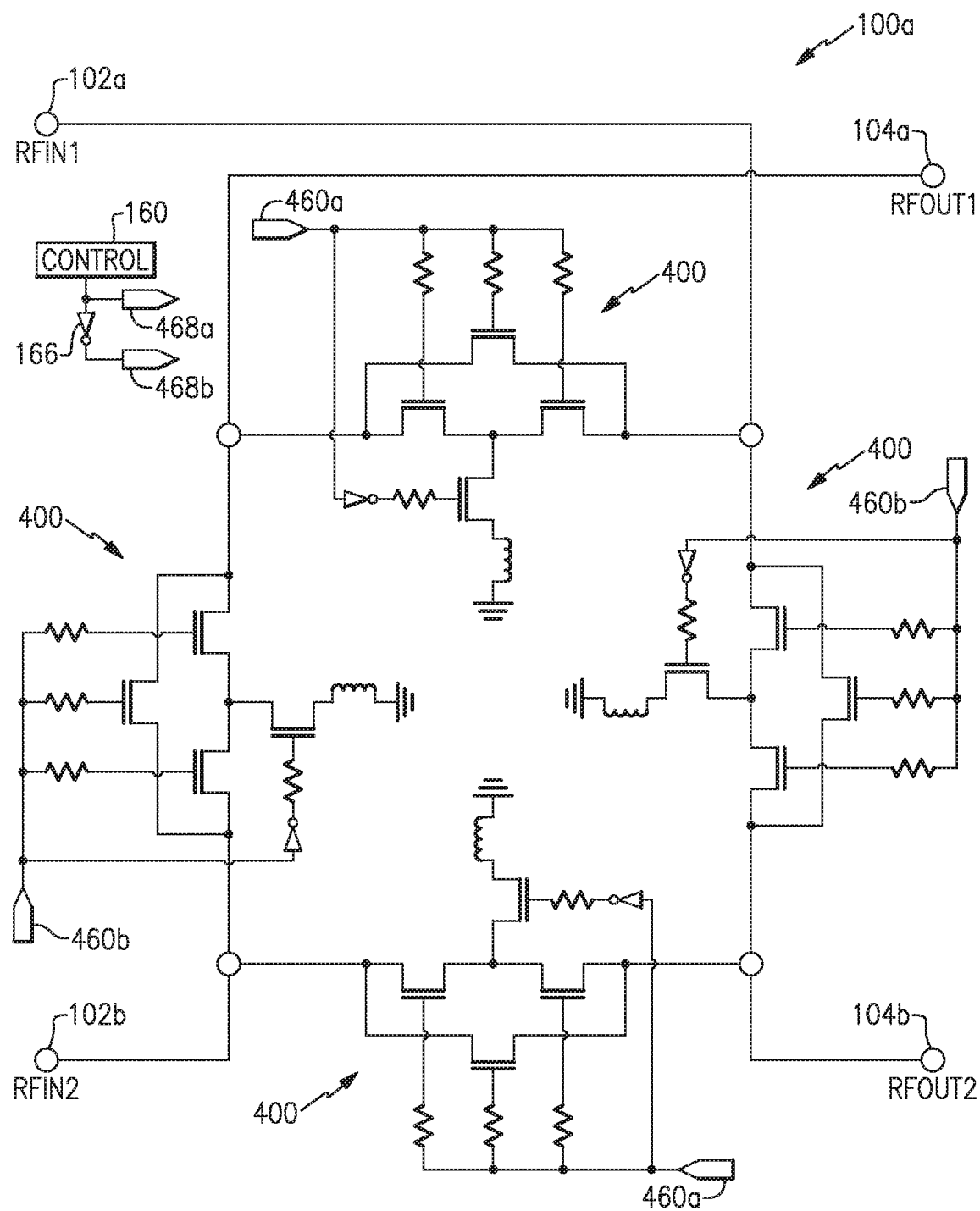
FIG. 6A is a schematic diagram of an example of a swap switch implemented with switches of the type shown in FIGS. 4A-4D.

FIG. 6A is a schematic diagram of a swap switch 100a (e.g., swap switch 100) implemented with four switches 400 including two inputs 102 and two outputs 104. Each of the switches 400 has a control input 460 to receive control signals from a controller 160. For example, the controller 160 may include a control signal output 468a that may be coupled to the control inputs 460a, and the controller 160 may include an inverted 166 control signal output 468b that may be coupled to the control inputs 460b. As discussed above, in some examples a decoder may provide the control signal outputs 468a, 468b. Such an arrangement allows for two states of the swap switch 100a. In a first or direct state, the first input 102a is coupled to the first output 104a and the second input 102b is coupled to the second output 104b. In a second or swapped state, the first input 102a is coupled to the second output 104b and the second input 102b is coupled to the first output 104a. In certain examples the controller 160 may be considered part of the swap switch 100a (or any examples of the switches disclosed herein), while in other examples a controller may be separate from the switch. The swap switch 100a of FIG. 6A is an example of a dual pole dual throw (DPDT) switch, at least because it has two inputs and two outputs. Other input and output switching arrangements may be equivalently implemented using transistor-based switches in accord with aspects and examples disclosed herein.

Figure 6B:
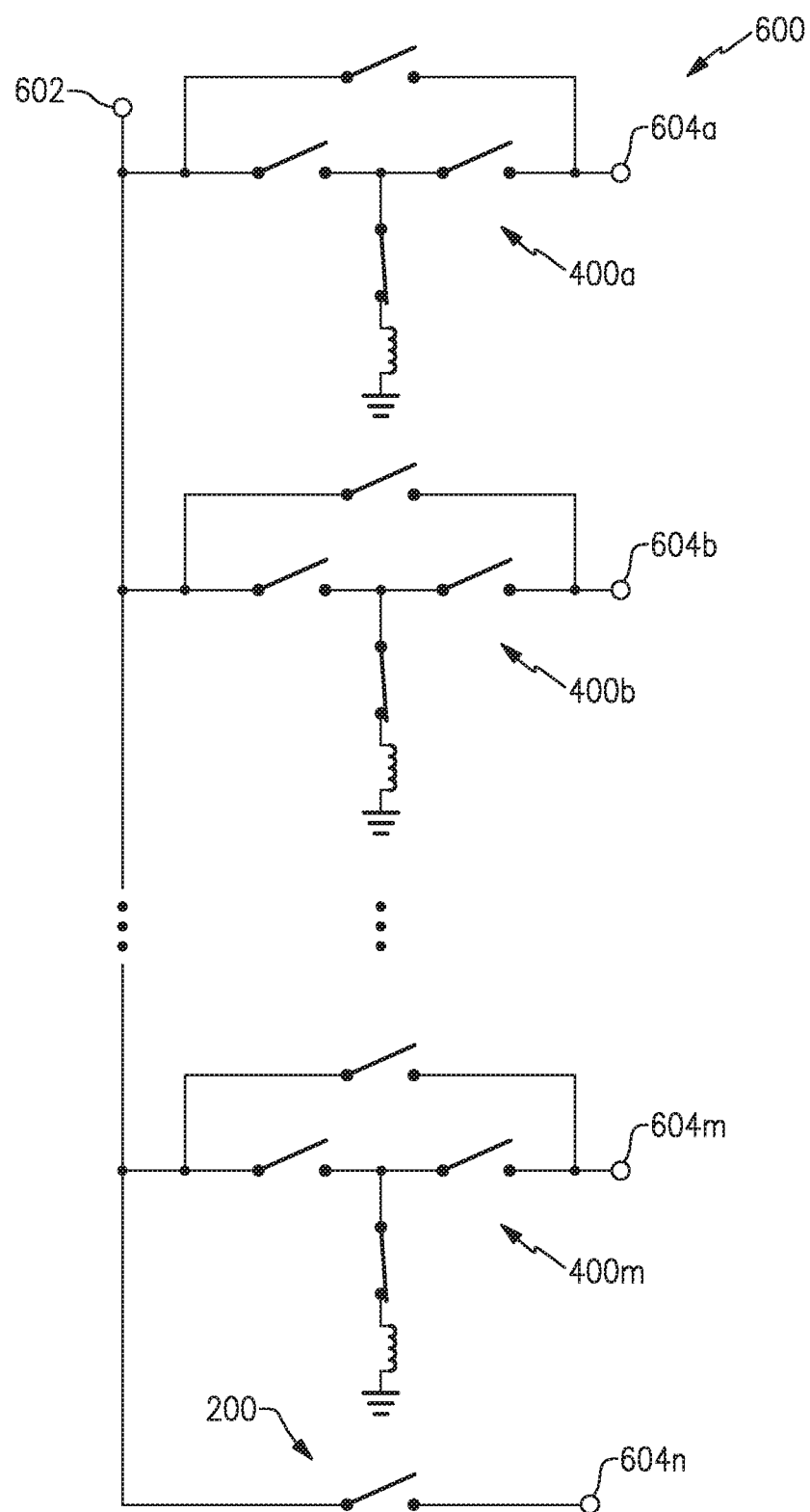
FIG. 6B is a schematic diagram of an example of a single pole n-throw switch implemented with switches of the type shown in FIGS. 4A-4D.

FIG. 6B illustrates a switch 600 that is a single pole n-throw (SPnT) switch implemented with, e.g., a plurality of the transistor-based switch 400. The switch 600 includes an input 602 commonly connected to multiple switch arms, each of which provides one of multiple outputs 604. Any number of switch arms, and outputs 604, may be provided, connected to the common input 602, as illustrated by indexes a, b, . . . , n. In this example of an SPnT switch 600, one of the switch arms is a low isolation switch 200 that provides the output 604n. In certain examples, any switch arm may not necessitate the relatively higher isolation of, e.g., a switch 400, and may use a lower isolation switch, such as the switch 200. The switch 600 does not require that a signal handled by the switch 600 propagate in a certain direction, and in certain examples the input 602 and the outputs 604 may be reversed to provide multiple inputs and a single output. Similarly, the switch 600 may be advantageously applied to multi-point and bi-directional switching, accommodating signals traveling from the input 602 to one or more of the outputs 604 while simultaneously accommodating signals traveling from any of the outputs 604 to one or more of the input 602 and other of the outputs 604.

Figure 7:
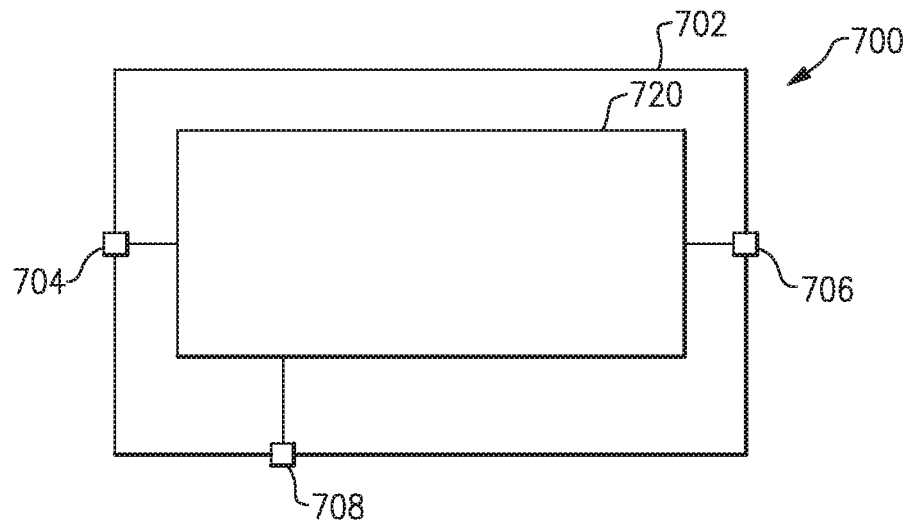
FIG. 7 is a block diagram of one example of a module including a signal switch.

Embodiments of signal switches in accord with those disclosed herein can be implemented in a variety of different modules including, for example, a stand-alone switch module, a front-end module, an antenna switching module, an impedance matching module, an antenna tuning module, or the like. FIG. 7 illustrates one example of a module that can include any of the embodiments or examples of the signal switches discussed herein.

FIG. 7 is a block diagram of one example of a module 700 including a signal switch 720, for example, any example of the signal switches disclosed herein. The module 700 includes a substrate 702 and may include various dies and may include packaging, such as, for example, an overmold to provide protection and facilitate easier handling. An overmold may be formed over substrate 702 and dimensioned to substantially encapsulate the various dies and components thereon. The module 700 may further include connectivity from the signal switch 720 to the exterior of the packaging to provide signal interconnections, such as an input port connection 704, an output port connection 706, and a control input connection 708. The connections 704, 706, and 708 may be provided in part by wirebonds or solder bumps, for example, and may include multiple electrical connections where appropriate. As discussed above, a signal switch 720 may have additional inputs and outputs.

Embodiments of the signal switches disclosed herein, optionally packaged into a module 700, may be advantageously used in a variety of electronic devices. Examples of the electronic devices can include, but are not limited to, consumer electronic products or components thereof, electronic test equipment, communications infrastructure (such as a base station, router, transmitter, etc.) and more. Specific examples of such electronic devices include, but are not limited to, a mobile phone such as a smart phone, a tablet, a telephone, a television, a computer or computer peripheral, a modem, such as a cable modem or otherwise, a wireless router or access point, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 8:
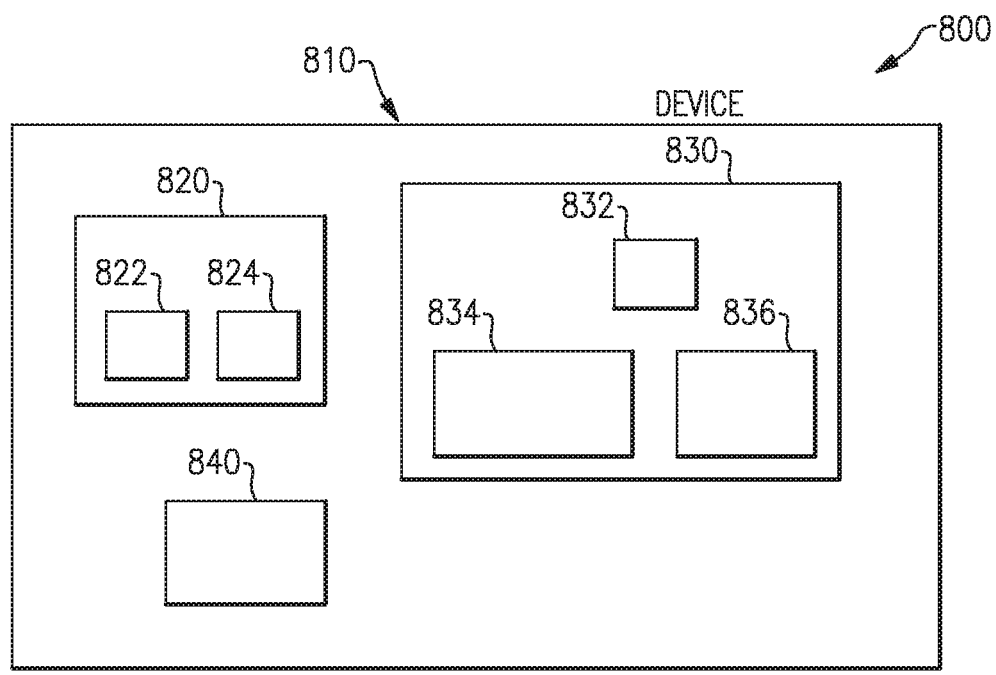
FIG. 8 is a block diagram of one example of an electronic device that may include a signal switch.

FIG. 8 is a schematic block diagram of a generic example of an electronic device 800. The electronic device 800 includes a circuit board 810 having numerous modules 820, 830, 840 mounted thereon. The circuit board 810 may have multiple layers and may include circuit elements and interconnections in the layers and/or mounted on the surface of the circuit board 810. Each of the modules 820, 830, 840 may have a multi-layer substrate within and upon which there may also be various circuit elements and interconnections. Additionally, the modules 820, 830, 840 may further include surface mounted dies, e.g., dies 822, 824, 832, 834, 836, each of which may have multiple layers and include various circuit elements and interconnections. One or more signal switches in accord with aspects and embodiments disclosed herein may be implemented within, among, or across any of the layers of the various structures, e.g., circuit board, substrates, and dies, as part of an electronic device 800, such as a cell phone, tablet, smart device, router, cable modem, wireless access point, etc.

Figure 9A:
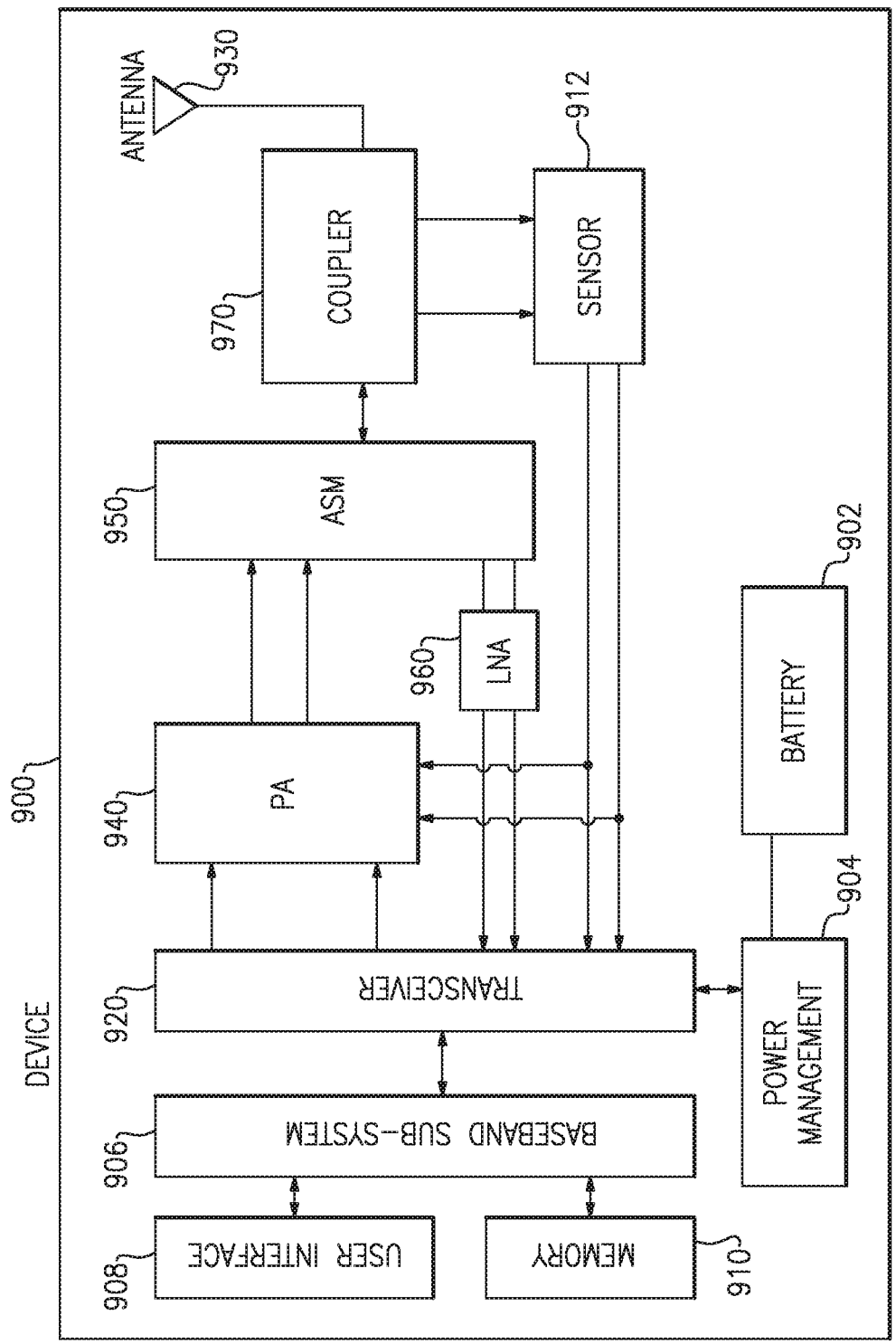
FIGS. 9A-9C are block diagrams of various examples of electronic devices that include a signal switch.
Figure 9B:
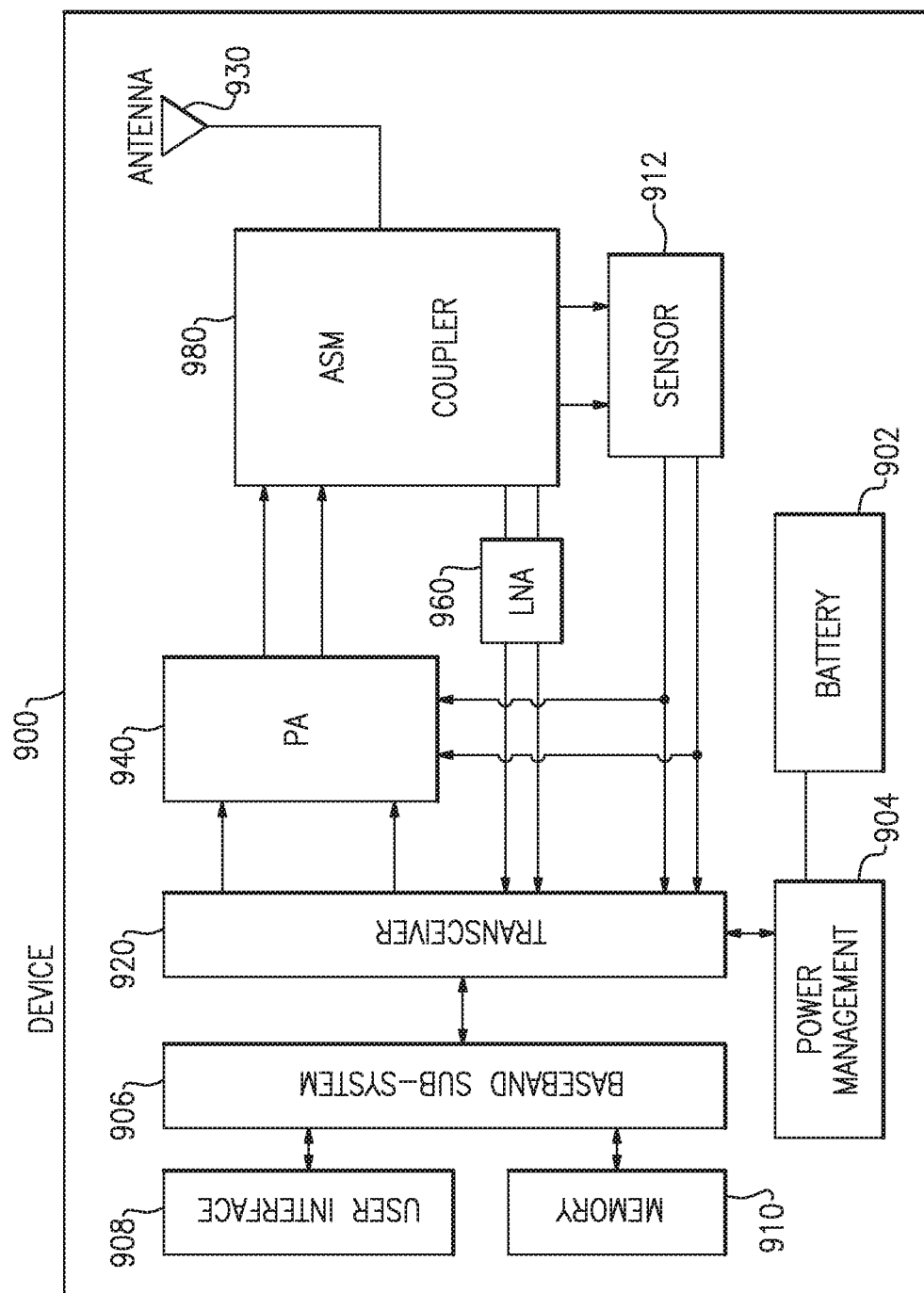
Figure 9C:
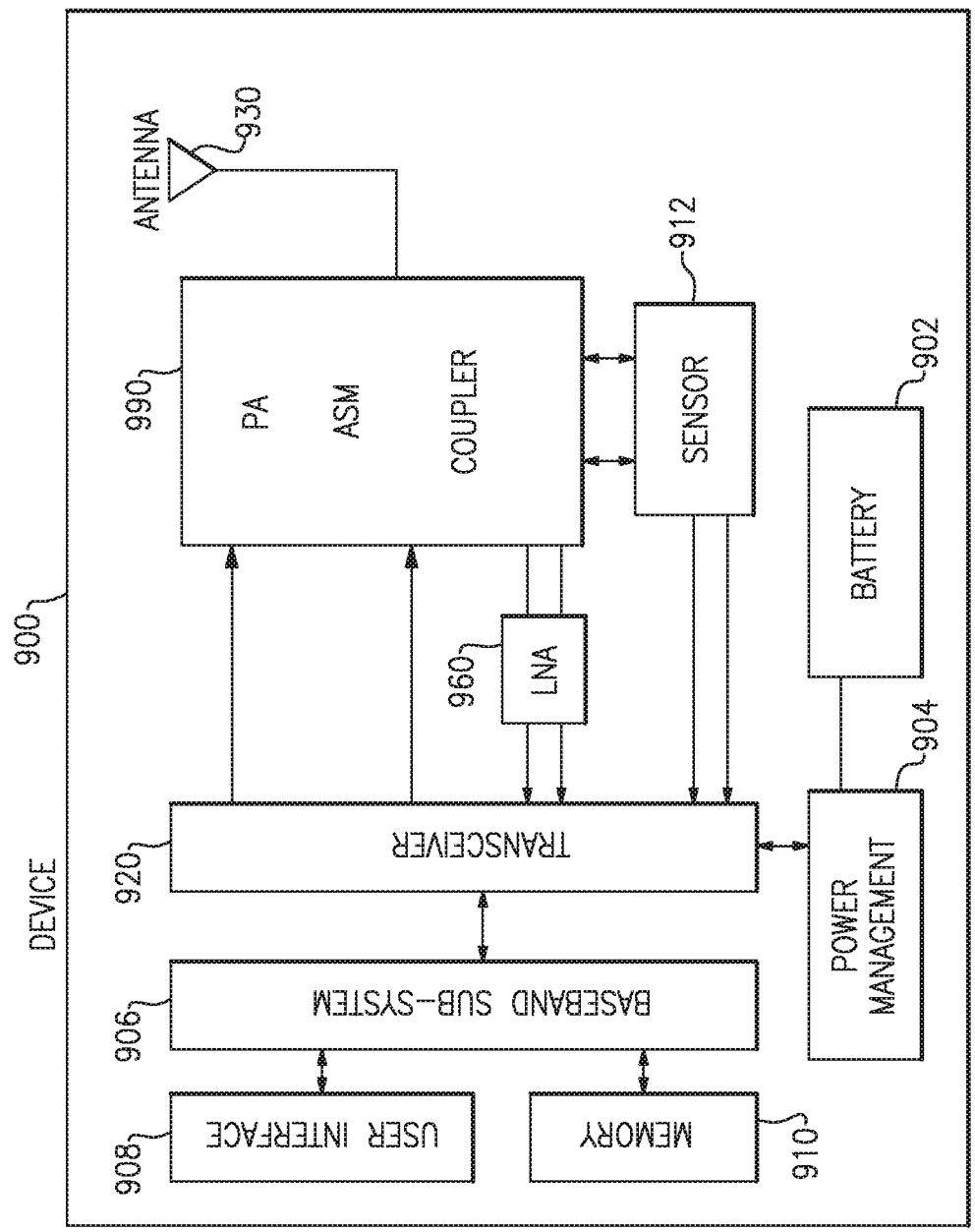

FIGS. 9A-9C illustrate examples of electronic devices 900 that include a signal switch according to various embodiments discussed above. For example, a signal switch, such as the signal switch 400, may be incorporated into the antenna switch module 950 to control direction and routing of transmit and receive signals. In a forward or transmit direction, a power amplifier 940 receives a signal, such as a radio frequency (RF) signal, from the transceiver 920 and provides an amplified signal to the antenna 930 via the antenna switch module 950 and a coupler 970. Similarly, in the receive direction, a received signal is provided from the antenna 930 to the transceiver 920 via the coupler 970, the antenna switch module 950, and a low noise amplifier 960. The various examples of an electronic device 900 shown in FIGS. 9A-9C include an antenna 930 and are generally examples of wireless devices. In other examples, an electronic device may additionally or alternately include wired connections, such as a cable modem or wired router, which may include a physical connector for coupling to cables and the like. Various additional elements may be included in electronic devices and/or some elements may be omitted.

The power amplifier 940 amplifies an RF signal. The power amplifier 940 can be any suitable power amplifier. For example, the power amplifier 940 can include one or more of a single stage power amplifier, a multi-stage power amplifier, a power amplifier implemented by one or more bipolar transistors, or a power amplifier implemented by one or more field effect transistors. The power amplifier 940 can be implemented on a GaAs die, CMOS die, or a SiGe die, for example.

The antenna 930 can transmit the amplified signal, and receive signals. For example, in a cellular phone, wireless base station, or the like, the antenna 930 can transmit and receive RF signals to and from other devices. In alternate embodiments multiple antennas may be used.

The coupler 970 can extract a portion of the amplified transmit signal traveling between the power amplifier 940 and the antenna 930, or can extract a portion of a received signal or a reflected signal traveling from the antenna 930 toward the low noise amplifier 960 or the power amplifier 940. In either mode, the coupler 970 may provide the signal portion to a sensor 912 that provides power feedback by measuring the power of the signal portion.

The examples of device 900 of FIGS. 9A-9C further include a power management system 904 that is connected to the transceiver 920 that manages the power for the operation of the wireless device. The power management system 904 can also control the operation of a baseband sub-system 906 and other components of the device 900. The power management system 904 may manage power within the device 900 by, for example, providing power to the device 900 from a battery 902 or providing power to the device 900 from a power connector, and controlling a charge level of the battery 902 by controlling charge and discharge cycles and/or status of the battery 902.

In one embodiment, the baseband sub-system 906 is connected to a user interface 908 to facilitate various input and output of voice and/or data provided to and received from the user.

The baseband sub-system 906 can also be connected to memory 910 that is configured to store data and/or instructions to facilitate operation of the device 900, and/or to provide storage of information for the user.

The power amplifier 940 can be used to amplify a wide variety of RF or other frequency-band transmission signals. For example, the power amplifier 940 can receive an enable signal that can be used to pulse the output of the power amplifier to aid in transmitting a wireless local area network (WLAN) signal or any other suitable pulsed signal. The power amplifier 940 can be configured to amplify any of a variety of types of signal, including, for example, a Global System for Mobile (GSM) signal, a code division multiple access (CDMA) signal, a W-CDMA signal, a Long Term Evolution (LTE) signal, an EDGE signal, and the like. In certain embodiments, the power amplifier 940 and associated components including switches and the like can be fabricated on GaAs substrates using, for example, pHEMT or BiFET transistors, or on a Silicon substrate using CMOS transistors, as well as other semiconductor fabrication technologies.

Still referring to FIGS. 9A-9C, the device 900 may include switching arrangements having one or more signal switches as disclosed herein to route signals among components of the device 900. The implementations shown in FIGS. 9A-9C are intended to be exemplary in nature only and non-limiting.

The example shown in FIG. 9B includes a combination module 980 that includes one or more signal switches in accord with aspects and embodiments described herein as part of an antenna switch module, further combined with a coupler (e.g., coupler 970). The example shown in FIG. 9C includes a combination module 990 that includes one or more signal switches in accord with aspects and embodiments described herein as part of an antenna switch module further combined with a coupler and a power amplifier (e.g., PA 940) together as a front end module. Additional embodiments include an alternate front end module that further incorporates one or more low noise amplifiers (e.g., LNA 960) and/or sensors (e.g., sensor 912).

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A signal switch comprising:
   a first transistor coupled between first and second nodes;
   a plurality of second transistors coupled in series between the first and second nodes, in parallel with the first transistor;
   a third transistor coupled between the first node and a third node;
   a plurality of fourth transistors coupled in series between the first and third nodes, in parallel with the third transistor;

a first shunt path including a first shunt transistor and a first inductor connected in series between a reference node and a first connection point between two of the plurality of second transistors; and a second shunt path including a second shunt transistor and a second inductor connected in series between the reference node and a second connection point between two of the plurality of fourth transistors.

2. The signal switch of claim 1 further comprising a control input coupled to the first transistor, the plurality of second transistors, and the first shunt transistor, the control input being configured receive a control signal that selectively controls a conductive state of the first transistor, the plurality of second transistors, and the first shunt transistor to allow a signal to pass between the first and second nodes in a first operational state of the signal switch and to reject the signal from passing between the first and second nodes in a second operational state of the signal switch.

3. The signal switch of claim 2 further comprising an inverter connected between the control input and the first shunt transistor, the inverter configured to invert the control signal applied to the first shunt transistor to cause the first shunt transistor to be in an opposite conductive state relative to the conductive state of the first transistor and the plurality of second transistors.

4. The signal switch of claim 1 wherein the first shunt path includes a plurality of first shunt transistors connected in series with the first inductor.

5. The signal switch of claim 4 wherein the first transistor includes a plurality of first transistors connected in series between the first and second nodes.

6. The signal switch of claim 4 wherein the second shunt path includes a plurality of second shunt transistors connected in series with the second inductor.

7. The signal switch of claim 6 wherein the third transistor includes a plurality of third transistors connected in series between the first and third nodes.

8. An electronic device comprising:
a transceiver coupled to a first node and configured to produce a transmit signal;
a first transistor coupled between the first node and a second node;
a plurality of second transistors coupled in series between the first and second nodes, in parallel with the first transistor;
a third transistor coupled between the first node and a third node;
a plurality of fourth transistors coupled in series between the first and third nodes, in parallel with the third transistor;
a first shunt path including a first shunt transistor and a first inductor connected in series between a reference node and a first connection point between two of the plurality of second transistors; and
a second shunt path including a second shunt transistor and a second inductor connected in series between the reference node and a second connection point between two of the plurality of fourth transistors.

9. The electronic device of claim 8 further comprising an antenna coupled to the second node, the antenna being configured to transmit the transmit signal and to receive a receive signal.

10. The electronic device of claim 8 further comprising an electromagnetic coupler coupled to the second node.

11. The electronic device of claim 8 further comprising a control input coupled to the first transistor, the plurality of second transistors, and the first shunt transistor, the control input being configured receive a control signal that selectively controls a conductive state of the first transistor, the plurality of second transistors, and the first shunt transistor to selectively allow a signal to pass between the first and second nodes or to reject the signal from passing between the first and second nodes.

12. The electronic device of claim 11 further comprising a first inverter connected between the control input and the first shunt transistor, the first inverter configured to invert the control signal applied to the first shunt transistor to cause the first shunt transistor to be in an opposite conductive state relative to the conductive state of the first transistor and the plurality of second transistors.

13. The electronic device of claim 12 wherein the control input is further coupled to the third transistor, the plurality of fourth transistors, and the second shunt transistor, and the control signal selectively controls a conductive state of the third transistor, the plurality of fourth transistors, and the second shunt transistor to selectively allow the signal to pass between the first and third nodes or to reject the signal from passing between the first and third nodes.

14. The electronic device of claim 13 further comprising a second inverter connected between the control input and the second shunt transistor, the second inverter configured to invert the control signal applied to the second shunt transistor to cause the second shunt transistor to be in an opposite conductive state relative to the conductive state of the third transistor and the plurality of fourth transistors.

15. The electronic device of claim 12 further comprising a resistor connected between the first inverter and a gate of the first shunt transistor.

16. The electronic device of claim 8 wherein the first shunt path includes a plurality of first shunt transistors connected in series with the first inductor.

17. The electronic device of claim 16 wherein the second shunt path includes a plurality of second shunt transistors connected in series with the second inductor.

18. The electronic device of claim 8 wherein the first transistor includes a plurality of first transistors coupled in series between the first and second nodes.

19. The electronic device of claim 18 wherein the third transistor includes a plurality of third transistors coupled in series between the first and third nodes.

20. The electronic device of claim 8 further comprising a power amplifier connected to the transceiver and configured to receive and amplify the transmit signal.

* * * * *